United States Patent
Butler

(10) Patent No.: US 6,532,177 B1
(45) Date of Patent: *Mar. 11, 2003

(54) LOW VOLTAGE CHARGE PUMP APPARATUS AND METHOD

(75) Inventor: Hal W. Butler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/136,742

(22) Filed: Apr. 30, 2002

Related U.S. Application Data

(63) Continuation of application No. 09/944,948, filed on Aug. 30, 2001, now Pat. No. 6,414,882.

(51) Int. Cl.$^7$ ................................................. G11C 7/00
(52) U.S. Cl. ........................... 365/189.09; 365/189.11; 365/226; 327/536; 327/537
(58) Field of Search ....................... 365/189.09, 189.11, 365/226; 327/536, 537

(56) References Cited

U.S. PATENT DOCUMENTS

| | | | |
|---|---|---|---|
| 6,225,854 B1 | * | 5/2001 | Cha .............................. 327/536 |
| 6,384,669 B2 | * | 5/2002 | Mecier et al. .............. 327/536 |
| 6,414,882 B1 | * | 7/2002 | Butler .................... 365/189.09 |

* cited by examiner

*Primary Examiner*—Son Mai
(74) *Attorney, Agent, or Firm*—Dorsey & Whitney LLP

(57) ABSTRACT

An apparatus and method for generating an elevated output voltage. The apparatus includes first and second boot nodes at which a respective elevated voltage is generated, first and second gate nodes, and an output node at which the elevated output voltage is provided. The apparatus further includes first and second switches, each having a gate terminal coupled to a respective gate node. The first switch couples the first boot node to the output node during a first portion of a first phase and the second switch couples the second boot node to the output node during a first portion of a second phase. A third switch couples to the first and second boot nodes for providing a conductive path through which charge can be shared between the first and second boot nodes during a second portion of the first and second phases.

20 Claims, 8 Drawing Sheets

LOW VOLTAGE CHARGE PUMP APPARATUS AND METHOD

CROSS-REFERENCE TO RELATED APPLICATION

This application is a continuation of U.S. patent application Ser. No. 09/944,948, filed Aug. 30, 2001 now U.S. Pat. No. 6,414,882.

TECHNICAL FIELD

The present invention relates to voltage generating circuits, and, more particularly, to a method and circuit for generating a pumped output voltage from a low input voltage.

BACKGROUND OF THE INVENTION

In many electronic circuits, charge pump circuits are utilized to generate a positive pumped voltage having an amplitude greater than that of a positive supply voltage, or to generate a negative pumped voltage from the positive supply voltage, as understood by those skilled in the art. For example, a typical application of a charge pump circuit is in a conventional dynamic random access memory ("DRAM"), to generate a boosted word line voltage VCCP having an amplitude greater than the amplitude of a positive supply voltage VCC or a negative substrate or back-bias voltage Vbb that is applied to the bodies of NMOS transistors in the DRAM. A charge pump may also be utilized in the generation of a programming voltage VPP utilized to program data into memory cells in non-volatile electrically block-erasable or "FLASH" memories, as will be understood by those skilled in the art.

FIG. 1a is a block diagram of a dynamic random access memory ("DRAM") 100 including a charge pump circuit. The DRAM 100 includes an address decoder 102, control circuit 104, and read/write circuitry 106, all of which are conventional. The address decoder 102, control circuit 104, and read/write circuitry 106 are all coupled to a memory-cell array 108. In addition, the address decoder 102 is coupled to an address bus, the control circuit 104 is coupled to a control bus, and the read/write circuit 106 is coupled to a data bus. The pumped output voltage VCCP from a charge pump circuit 110 may be applied to a number of components within the DRAM 100, as understood by those skilled in the art. In the DRAM 100, the charge pump circuit 110 applies the pumped output voltage VCCP to the read/write circuitry 106, which may utilize this voltage in a data buffer (not shown) to enable that buffer to transmit or receive full logic level signals on the data bus. The charge pump circuit 110 also applies the voltage VCCP to the address decoder 102 which, in turn, may utilize the voltage to apply boosted word line voltages to the array 108. In operation, external circuitry, such as a processor or memory controller, applies address, data, and control signals on the respective busses to transfer data to and from the DRAM 100.

FIG. 1b is a functional block diagram of an electrically erasable and programmable or FLASH memory 150 having an array 152 of FLASH cells (not shown), and including a charge pump 153. When contained in a FLASH memory, the charge pump circuit 153 would typically generate a boosted programming voltage VPP that is utilized to program data into nonvolatile memory cells in the array 152, as understood by those skilled in the art. The FLASH memory 150 includes an address decoder 154, control circuit 156, and read/program/erase circuitry 158 receiving signals on address, control, and data busses, respectively. The address decoder 154, control circuit 156, and circuitry 158 are conventional components, as understood by those skilled in the art. During programming, the control circuit 156 and read/program/erase circuitry 158 utilize the boosted voltage VPP generated by the charge pump circuit 153 to provide the memory-cell array 152 with the required high voltage for programming FLASH memory cells in the array, as understood by those skilled in the art. The address decoder 154 decodes address signals applied on the address bus and utilizes the boosted voltage VPP to access corresponding FLASH memory cells or blocks of memory cells in the array 152. The circuit 158 places read data from addressed cells in the array 152 onto the data bus during normal operation of the FLASH memory 150.

FIG. 2a illustrates a conventional charge pump circuit 200. A pulse generator 204, typically driven by a clock signal CLK, provides pulse signals to a boot circuit 208 which generates a pumped voltage VCCP. The boot circuit 208 includes two pump stages 210 and 212 that operate in an interleaved fashion to provide a VCCP voltage at an output node 250. The pump stages 210 and 212 are identical, and the following description of the pump stage 210 can be applied to the pump stage 212. FIG. 2b shows a signal diagram illustrating the signals at a boot node 220 and a node 230. Prior to time $t_0$, the nodes 220 and 230 are pre-charged to VCC through transistors 270 and 272, respectively. The gates of the transistors 270 and 272 are coupled to nodes 232 and 222, respectively, to allow for the full VCC voltage to be applied to the respective nodes during pre-charge. Similarly, nodes 222 and 232 are pre-charged to VCC through transistors 274 and 276, which have gates coupled to the nodes 230 and 220, all respectively.

At time $t_0$, the pulse generator 204 provides a HIGH output signal to the pump stage 210. In response, the boot node 220 is booted through a capacitor 264. Similarly, as seen in FIG. 2b, a capacitor 260 boots the node 230 as well. However, note that the voltage at the node 230 is not sufficient to switch transistor 244 ON. Eventually, at a time $t_1$, the pulse generator provides a HIGH output signal to the capacitor 262 to further drive the node 230. At this time, the voltage on the node 230 is booted to a level sufficient to switch ON the transistor 244 in order to charge the output node 250. From time $t_1$ to $t_2$, the boot node 220 discharges into the output node 250. At a time $t_2$, in response to the signal applied to the capacitors 262 and 264 going LOW, the voltage of the nodes 220 and 230 go LOW as well. Although not shown in FIG. 2b, the voltage of the nodes 222 and 232 of the pump stage 212 behave in a manner similar to that shown for the pump stage 210 during the time the pump stage 210 is inactive, that is, between times $t_2$ and $t_3$. As a result, the output voltage VCCP can be maintained at a relatively constant elevated voltage level.

Although the conventional charge pump circuit 200 can provide a pumped voltage VCCP, the efficiency of the charge pump circuit 200 may become an issue as device operating voltages continue to decrease. In a sever case where the operating voltage is too low, the output of such a charge pump circuit may not be sufficient to drive the circuitry requiring pumped voltages. A simple solution has been to include multiple boot circuits to provide sufficient drive levels. However, this solution typically results in increased power consumption, and increased pump size, and consequently, increased die size, which are generally considered undesirable. Therefore, there is a need for a charge pump circuit that can efficiently generate a sufficient pumped output voltage from relatively a low supply voltage.

SUMMARY OF THE INVENTION

The present invention is directed to an apparatus and method for generating an elevated output voltage in response a first set of pulses during a first phase and a second set of pulses during a second phase. The apparatus includes first and second boot nodes at which a respective elevated voltage is generated, first and second gate nodes, and an output node at which the elevated output voltage is provided. The apparatus further includes first and second switches, each having a gate terminal coupled to a respective gate node. The first switch couples the first boot node to the output node during a first portion of the first phase and the second switch couples the second boot node to the output node during a first portion of the second phase. A third switch couples to the first and second boot nodes for providing a conductive path through which charge can be shared between the first and second boot nodes during a second portion of the first and second phases.

BRIEF DESCRIPTION OF THE DRAWINGS

FIG. 2b is a signal diagram illustrating various signals of the charge pump circuit of FIG. 2a.

DETAILED DESCRIPTION OF THE INVENTION

Embodiments of the present invention are directed to an apparatus and method for generating an elevated output voltage from a relatively low input voltage. The apparatus conserves charge within the system of the apparatus to improve efficiency. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1A:
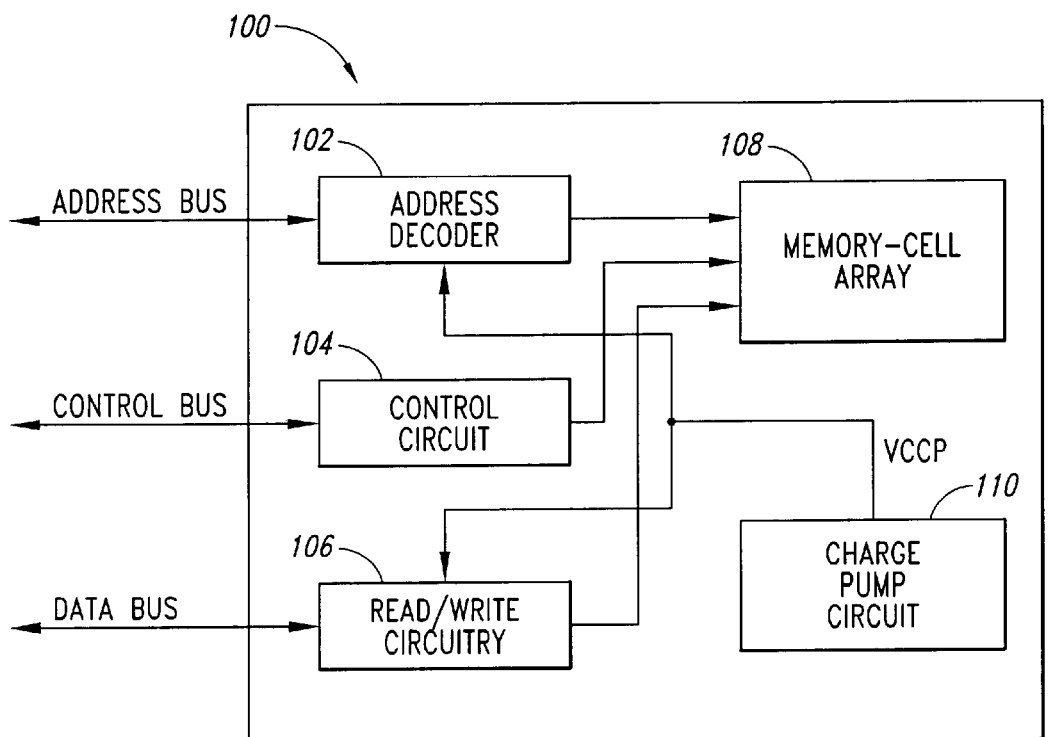
FIGS. 1a and 1b are functional block diagrams of a DRAM and of a FLASH memory, respectively, according to the prior art.
Figure 1B:
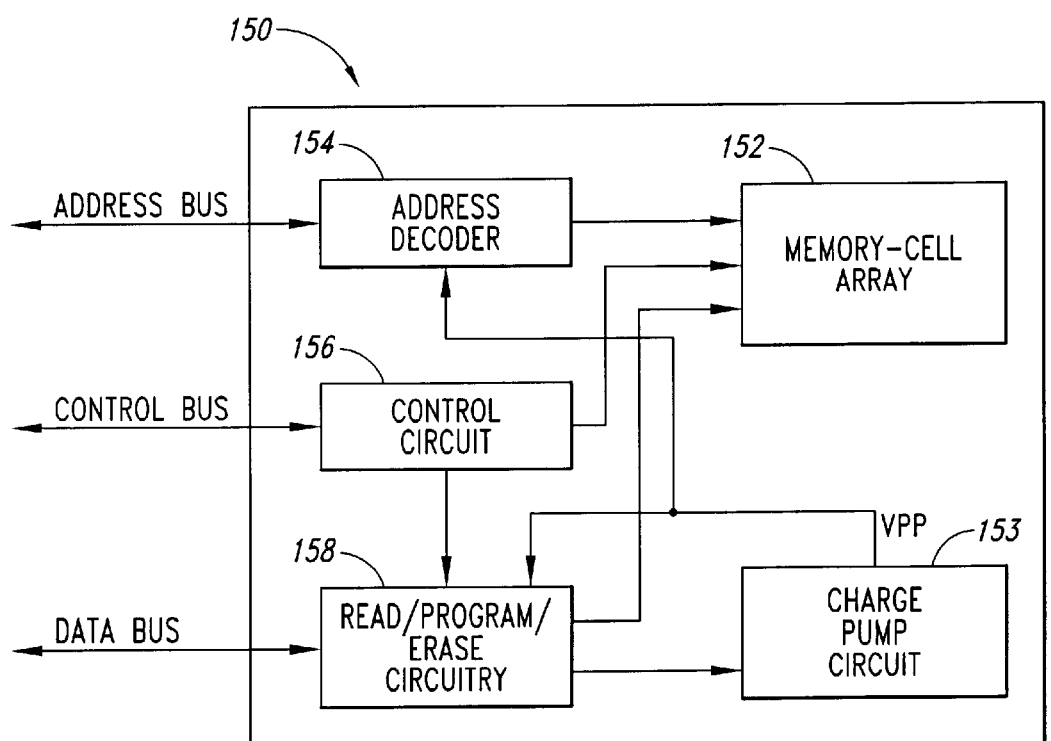
Figure 2A:
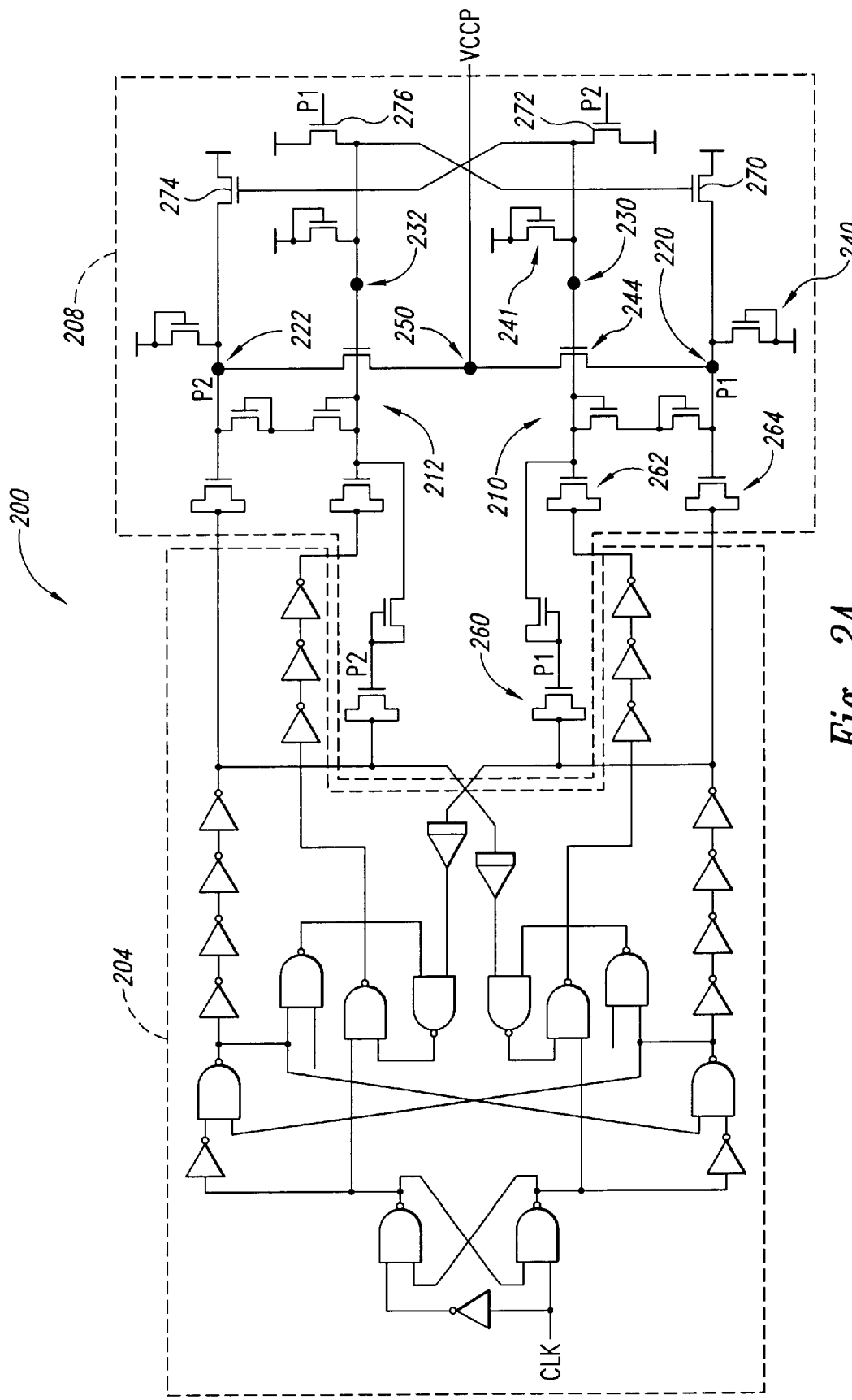
FIG. 2a is a schematic diagram of conventional charge pump circuit.
Figure 2B:
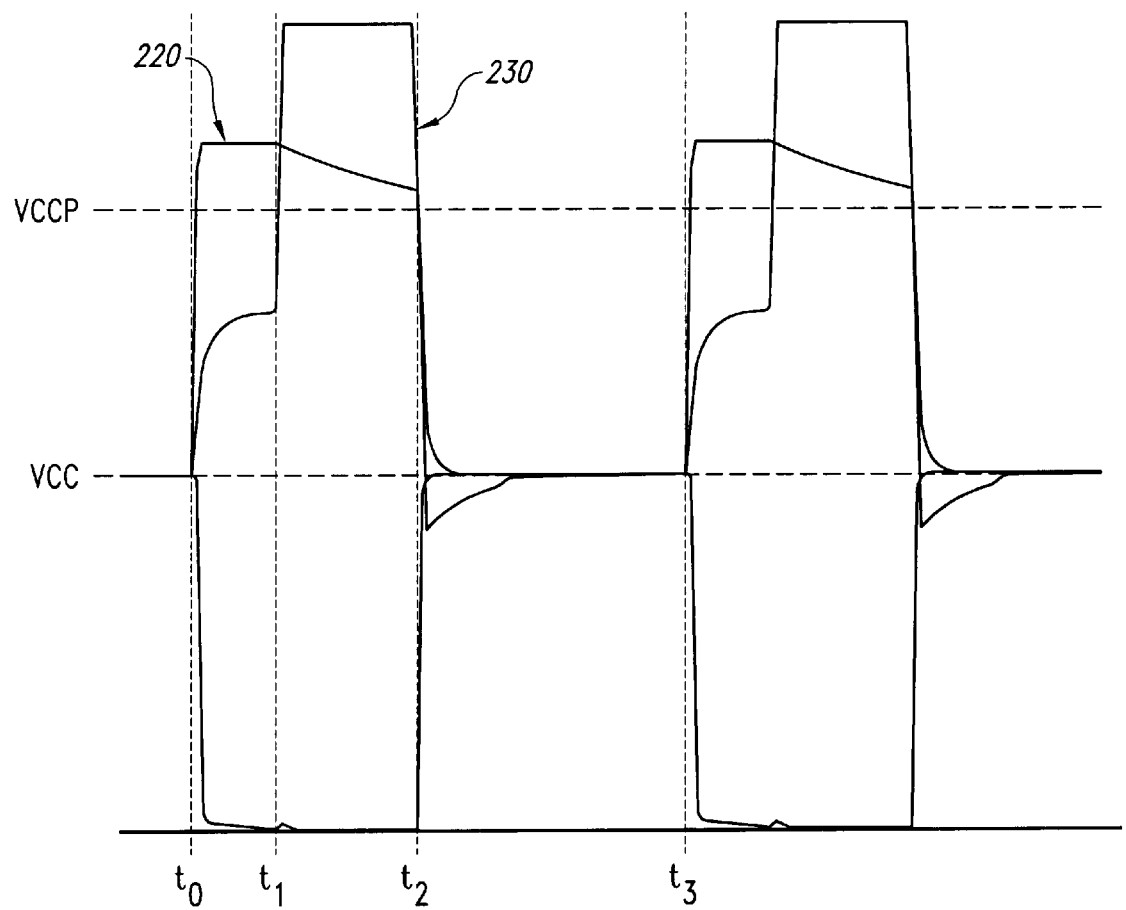
Figure 3:
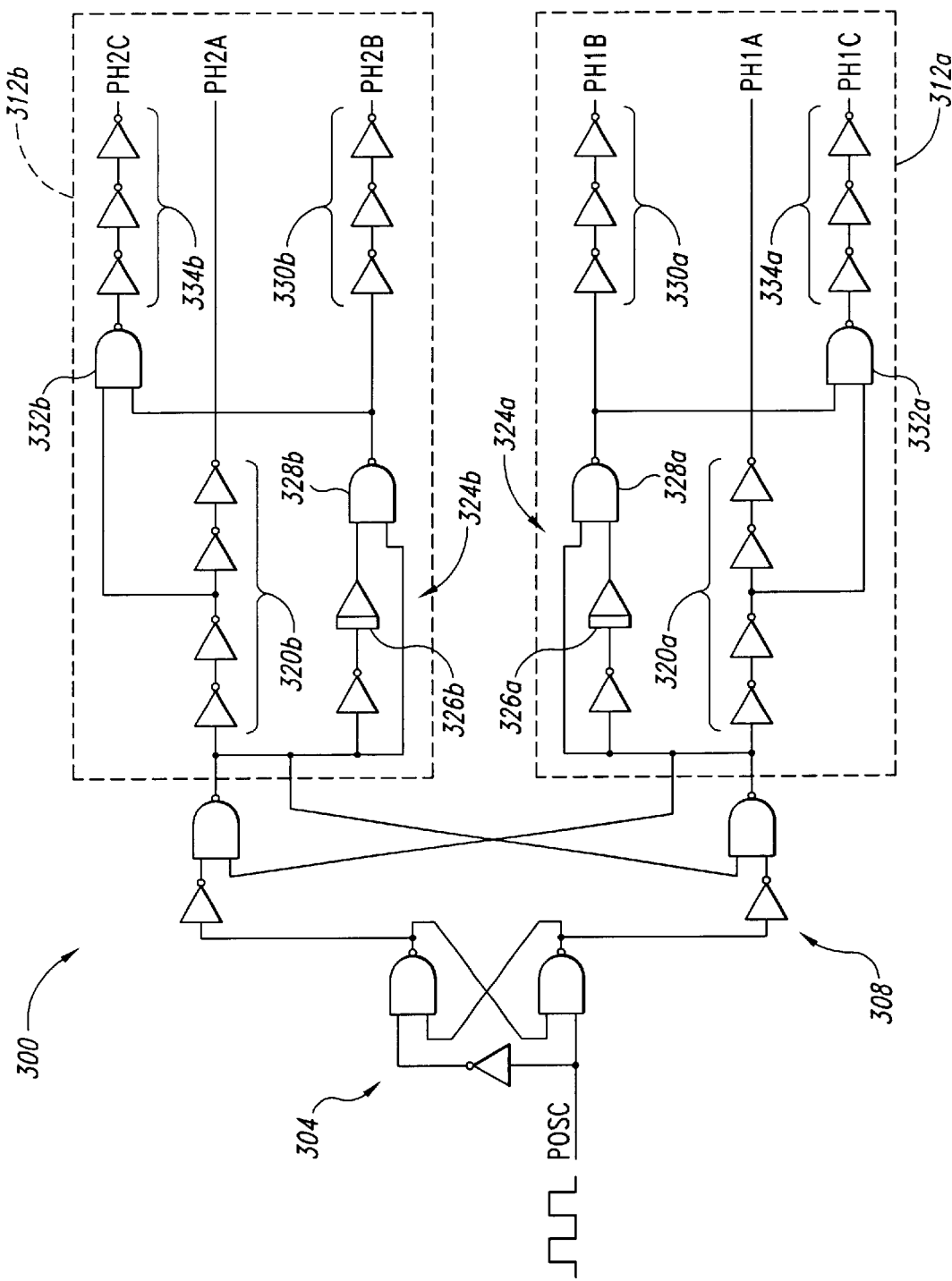
FIG. 3 is a schematic diagram illustrating a pulse generator according to an embodiment of the present invention.

FIG. 3 illustrates a pulse generator 300 according to an embodiment of the present invention. The pulse generator 300 includes an active low set-reset (S-R) latch 304 formed from cross-coupled NAND gates. A true signal of an input clock signal POSC is applied to a first input of the latch 304, and a complement of the POSC signal is applied to a second input of the latch 304. Provision of an appropriate clock signal is well understood by those of ordinary skill in the art, and will not be discussed in any greater detail herein in the interest of brevity. The outputs of the latch 304 are provided through respective inverters to a second S-R latch 308 also formed from cross-coupled NAND gates. A first output of the latch 308 is provided to a pulse circuit 312a and a second output is provided to a similar pulse circuit 312b. The structure and operation of the pulse circuits 312a and 312b are identical, and consequently, the description of the pulse circuit 312a is applicable to the pulse circuit 312b. As will be explained in more detail below, the operation of the pulse circuits 312a and 312b is in an interleaved fashion.

As discussed previously, the pulse circuit 312a has an input coupled to one of the outputs of the latch 308. The input signal is provided to chain of inverters 320a having an output providing an output signal PH1A. The input signal is also provided to a pulse sub-circuit 324a having a delay circuit 326a The pulse sub-circuit 324a generates a pulse having a pulse width based on the delay of the delay circuit 326a. The output of the pulse sub-circuit 324a is coupled to a chain of inverters 330a having an output that provides an output signal PH2B. The pulse circuit 312a further includes a NAND gate 332a having an input coupled to the output of the pulse sub-circuit 324a and another input coupled the output of the second inverter of the chain of inverters 320a. The output of the NAND gate 332a is provided to a chain of inverters 334a, which has an output that provides an output signal PH2C.

Figure 4:
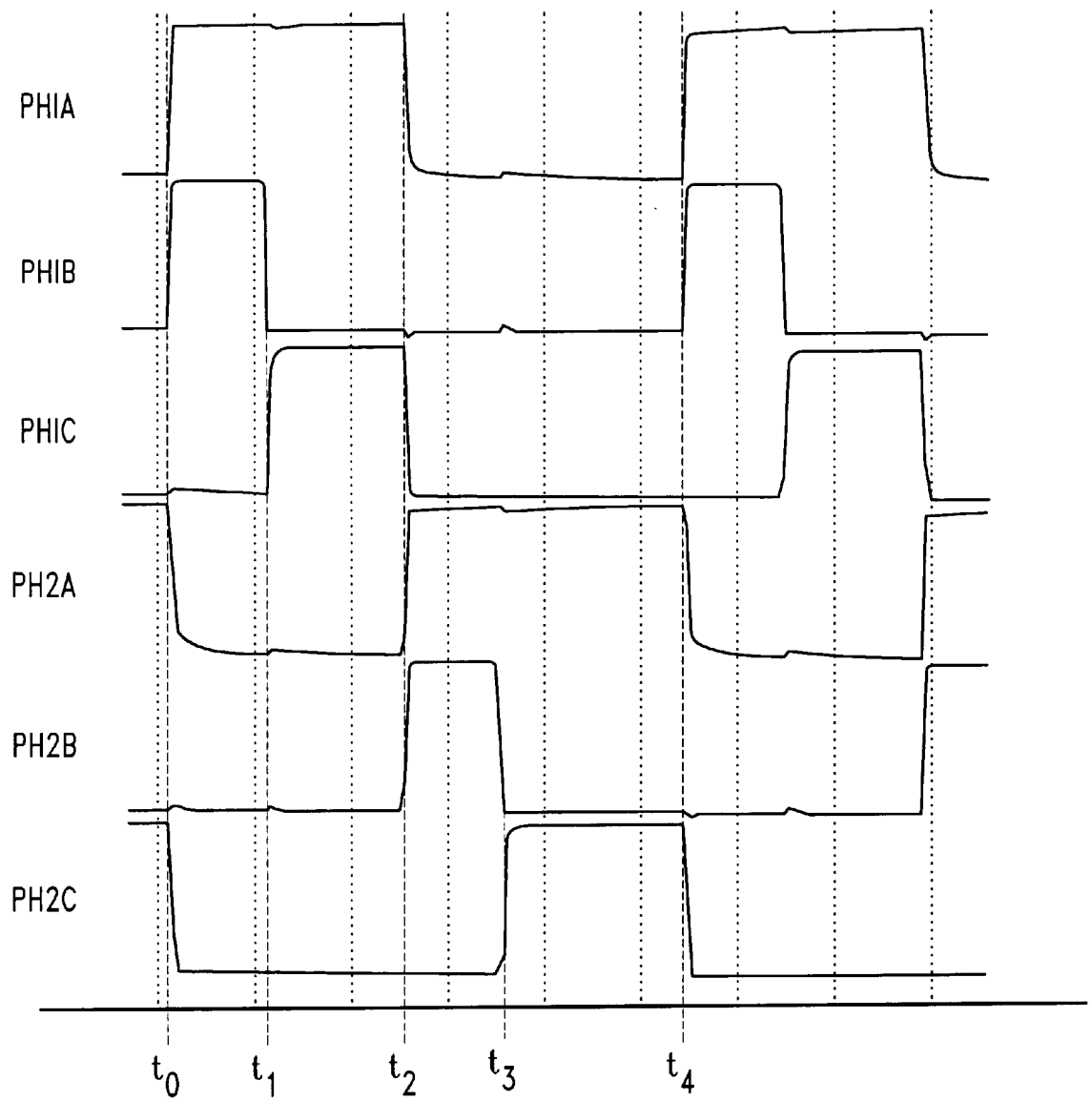
FIG. 4 is a signal diagram illustrating the output of the pulse generator of FIG. 3.

The output signals of the pulse generator 300 in response to the POSC signal are illustrated in FIG. 4. The PH1A, PH1B, and PH1C signals are provided by the pulse circuit 312a, and the PH2A, PH2B, and PH2C signals are provided by the pulse circuit 312b. In response to a LOW POSC signal, the output signal of the latch 308 coupled to the pulse circuit 312a goes HIGH. The HIGH output signal of the latch 308 propagates through the chain of inverters 320a to provide a HIGH PH1A signal at time $t_0$. The PH1B signal initially goes HIGH as well because the NAND gate 328a of the pulse sub-circuit 324a receives a HIGH signal at both its inputs. The PH1C signal remains low for the time being because of the HIGH and LOW signals applied to the inputs of the NAND gate 332a. At a time $t_1$, the HIGH output signal has eventually propagated through the inverter and the delay circuit 326a to the second input of the NAND gate 328b, causing the PH1B signal to go LOW. As a result, the PH1C signal then goes HIGH because of the output of the NAND gate 332b is forced LOW in response to the output of the pulse sub-circuit 324a going HIGH.

When the POSC signal goes HIGH, the signal provided by the output of the latch 308 coupled to the pulse circuit 312a switches logic levels. In response, at time $t_2$, the PH1A and PH1C signals go low. Concurrently, the output of the latch 308 that is coupled to the input of the pulse circuit 312b switches from LOW to HIGH. Consequently, as previously explained with respect to the pulse circuit 312a, the PH2A and PH2B signals go HIGH. At time $t_3$, the input signal to the pulse circuit 312b has propagated through the delay circuit 326b and caused the PH2B signal to go low. Additionally, as the output signal of the NAND gate 324b switches from LOW to HIGH, the PH2C signal goes HIGH. Eventually, when the POSC signal goes LOW again, the PH2A and PH2C signals return LOW at time a $t_4$.

Figure 5:
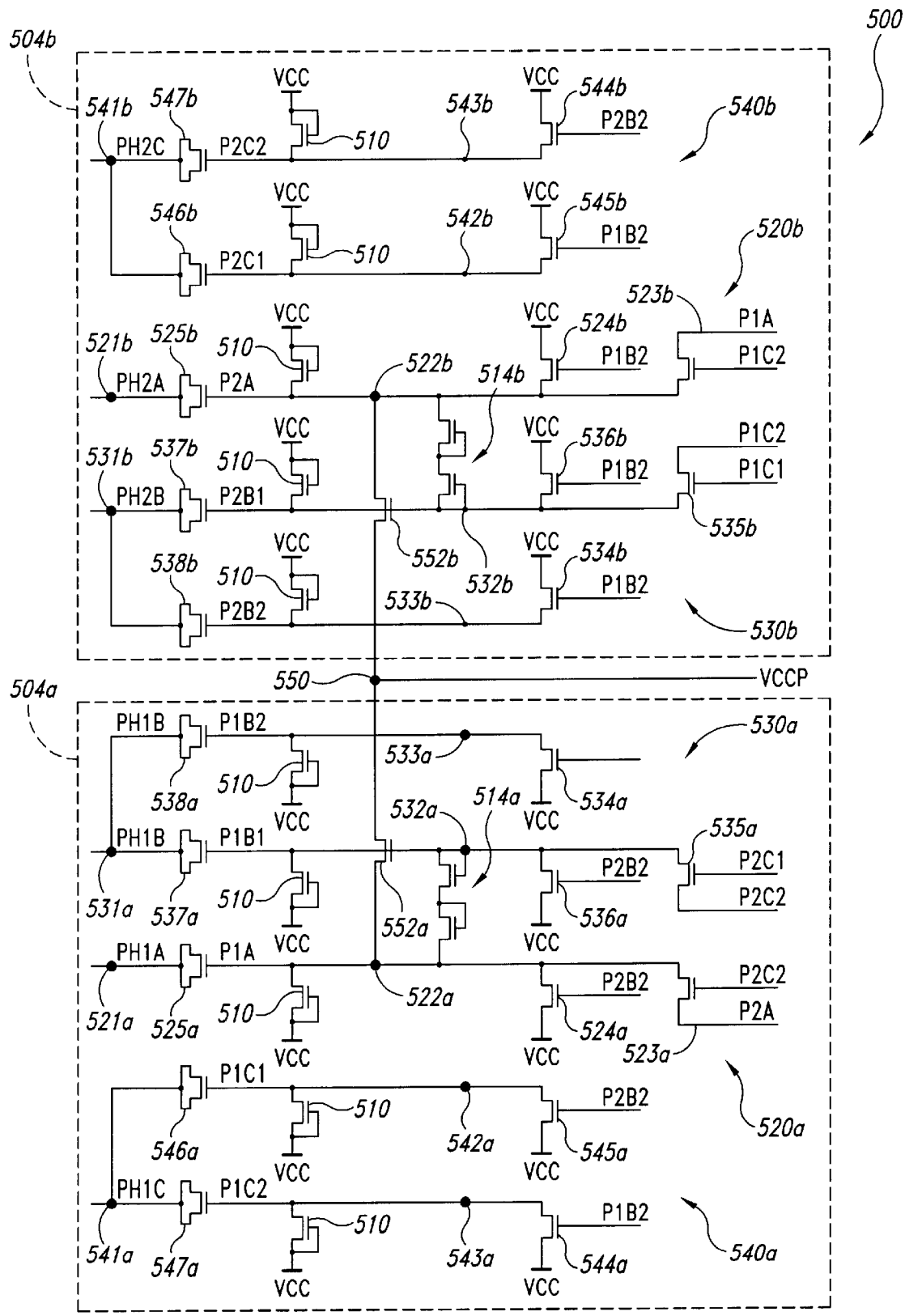
FIG. 5 is a schematic diagram illustrating a boot circuit according to an embodiment of the present invention.

FIG. 5 illustrates a boot circuit 500 according to an embodiment of the present invention. The boot circuit can be coupled to the phase generator 300 illustrated in FIG. 3 to create a charge pump circuit. The boot circuit 500 include two pump circuits 504a and 504b. Operation of the two pump circuits can generally be described as being interleaved, that is, the output node of the boot circuit 500 is driven by one of the pump circuits 504a and 504b at a given time. As will be explained in more detail below, the two pump circuits 504a and 504b are coupled so that excess charge of a boot node of one of the pump circuits is discharged into the boot node of the other pump circuit after driving the output node. This is in contrast with the conventional charge pump, where any excess charge on the boot nodes of the respective pump circuits are simply left to discharge to a lower potential. As a result of conserving charge within the boot nodes of the boot circuit 500, output current of the boot circuit 500 can be maintained at a lower operating voltage. Similarly, the operating voltage can be maintained, but power consumption would be reduced while providing the same output current.

The two pump circuits 504a and 504b are essentially identical, and consequently, the description of the structure of the pump circuit 504a applies to the pump circuit 504b as well. The pump circuit 504a includes three pump stages 520a, 530a, and 540a, each driven by a different output signal of the phase generator to which the boot circuit 500 is coupled. Where the boot circuit 500 is coupled to the phase generator 300 (FIG. 3), pump stage 520a is driven at a node 521a by the PH1A signal, the pump stage 530a is driven at a node 531a by the PH1B signal, and the pump stage 540a is driven at a node 541a by the PH1C signal. The signals are used to pump the charge of a node coupled to a respective capacitor. As illustrated in FIG. 5, the PH1A signal is used to increase the charge of a boot node 522a through a boot capacitor 525a. The PH1B signal is used to increase the charge of nodes 532a and 533a through capacitors 537a and 538a, respectively, and the PH1C signal is used to increased the charge of nodes 542a and 543a through capacitors 546a and 547a, respectively. Each of the nodes 522a, 532a, 533a, 542a, and 543a are pre-charged to at least a voltage of (VCC−Vt) through a respective diode connected transistor 510. Additionally, the nodes 522a, 532a, 533a, and 542a are further pre-charged through a respective transistor coupled to VCC and having a gate driven by node 533b of the pump circuit 504b, and the node 543a is further pre-charged through transistor 544a having a gate coupled to the node 533a.

As mentioned previously, excess charge of the boot node of one pump circuit is discharged to the boot node of the other pump circuit in order to conserve charge within the entire boot circuit 500. With respect to the pump circuit 504a, the boot node 522a receives the excess charge from the boot node 522b through the transistor 523a. The gate of the transistor 523a is also controlled by the voltage of a node in the pump circuit 504b, namely, the node 543b.

In addition to sharing excess charge of the boot nodes of the pump circuits 504a and 504b, the nodes coupled to the gates of the transistors that couple the respective boot nodes to output node 550 are additionally pre-charged by a voltage provided by the other pump circuit. For example, the node 532a, which is coupled to the gate of the transistor 552a, is pre-charged by the node 534b of the pump circuit 504b. The additional charge on the node driving the transistor that couples a boot node to the output node 550 allows for the full charge of the boot node to be provided to the output node 550 without being limited by a relatively low gate voltage.

Operation of the boot circuit 500 will be explained with reference to the signal diagram of FIG. 6. It will be assumed that the boot circuit 500 is receiving input signals from a phase circuit providing clock signals according to the timing diagram of FIG. 4, for example, the phase circuit 300 (FIG. 3). Specifically, the PH1A, PH1B, and PH1C signals are applied to the nodes 521a, 531a, and 541a, respectively, of the pump circuit 504a. The PH2A, PH2B, and PH2C signals are applied to the nodes 521b, 531b, and 541b, respectively, of the pump circuit 504b.

Figure 6:
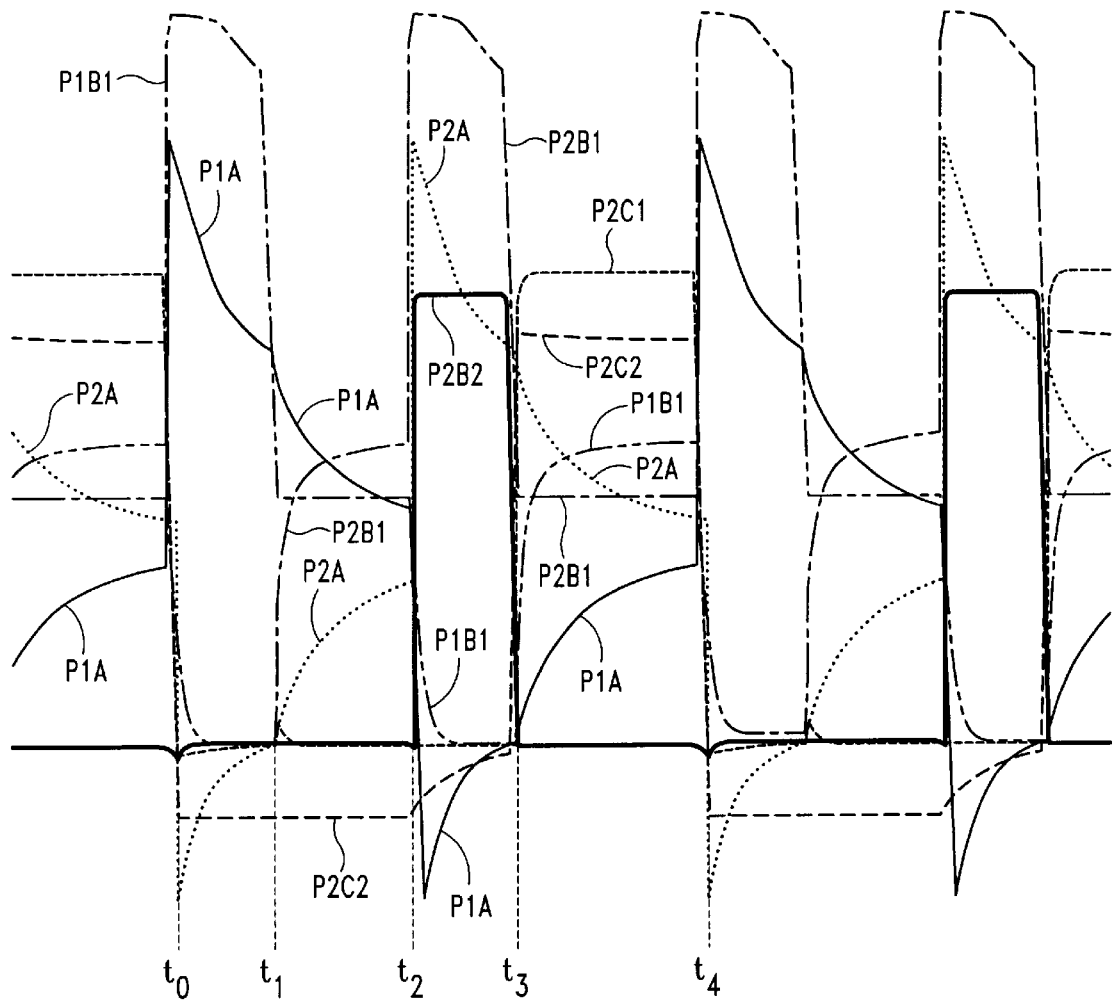
FIG. 6 is a signal diagram illustrating various signals of the boot circuit of FIG. 5.

As illustrated in FIGS. 4 and 6, the first pump phase is defined between times $t_0$ and $t_1$, and the second pwnp phase is defined between times $t_2$ and $t_4$. At the time $t_0$, the PH1A and PH1B signals go HIGH (FIG. 4), thus, booting up the boot node 522a (the P1A signal) and the nodes 532a (the P1B1 signal) and 533a (the P1B2 signal, not shown), respectively (FIG. 6). As illustrated in FIG. 6, and as will be explained in more detail below, the boot node 522a is pre-charged by the excess charge from the boot node 522b (the P2A signal) from the previous pump phase. The P1B1 signal switches ON the transistor 552a to couple the boot node 522a to the output node 550. The boot node 522a discharges into the output node 550 and pulls down the node 532a through series connected diode coupled transistors 514a until the P1B1 signal goes LOW in response to the PH1B signal going LOW (FIG. 4) at time $t_1$. The PH1C signal goes HIGH concurrently, booting up the nodes 542a and 543a. This in turn switches ON both transistors 523b and 535b. The transistor 523b allows for the excess charge of the boot node 522a from the present pump phase to be discharged into the boot node 522b in preparation for the following pump phase. As illustrated in FIG. 6, during times $t_1$ to $t_2$, the P1A signal discharges as the P2A signal charges. The transistor 535b couples the node 543a to the node 532b (the P2B1 signal) for pre-charging the node in preparation for the second pump phase.

At time $t_2$, the PH1A and PH1C signals go LOW and the PH2A and PH2B signals go HIGH. Consequently, the boot node 522b, and the nodes 532b and 533b, are charged, and the P2A, P2B1, and P2B2 signals, respectively, are booted by the active signals. As mentioned previously, during the previous pump phase, both the boot node 522b and the node 532b are pre-charged prior to the PH2A and PH2B signals going HIGH by discharging the boot node 522a and the node 543a of the boot circuit 504a. Thus, the overall voltage of the boot node 522b and the node 532b is greater than would be if the charge was not conserved within the boot circuit 500. The P2B1 signal switches ON the transistor 552b to couple the boot node 522b to the output node 550. The boot node 522b begins to discharge into the output node 550 to drive the VCCP signal. Note that the P2B1 signal decreases as the boot node 522b (the P2A signal) discharges because of the diode coupled transistors 514b. Further note that the P2C2 signal increases during times $t_2$ and $t_3$ because the P2B2 signal, which is booted by PH2B signal, drives the gate of the transistor 544b so that the full voltage of VCC can be applied to the node 543b.

At time $t_3$, the PH2B signal goes LOW, switching OFF the transistor 552b. Concurrently, the PH2C signal goes HIGH, driving the voltage on the nodes 542b and 543b (the P2C1 and P2C2 signals, respectively). The P2C2 signal switches ON the transistor 523a to couple the boot node 522b to the boot node 522a in order to pre-charge that node with any excess charge. The conservation of charge is illustrated in FIG. 6, that is, as the P2A signal decreasing between time $t_3$ and $t_4$ while the P1A signal correspondingly increases. The P1C2 signal also switches ON the transistor 535a to allow the P2C2 signal to precharge the node 532a (the P1B1 signal) in preparation of the next pump phase of the charge pump. At time $t_4$, the PH2A and PH2C signals go LOW, and the PH1A and PH1B signals go HIGH again to repeat the first pump phase.

In another embodiment of the present invention, multiple boot circuits and/or multiple pulse circuits can be utilized to provide an elevated voltage to a device. For example, multiple charge pump circuits can be operated in a staggered fashion in order to provide a sufficient pumped voltage level. Alternatively, multiple boot circuits coupled to a pulse circuit can be utilized as well.

It will be appreciated that although the previous description of the boot circuit 500 was made with reference to the pulse generator 300, modifications may be made to the particular structure of the boot circuit 500 and the pulse generator 300 without departing from the scope of the present invention. It will be further appreciated that although the use of charge pump circuits has been made with respect to DRAM and FLASH memory, in particular, one skilled in the art will realize the charge pump circuit may be utilized in any type of integrated circuit requiring a pumped voltage, including other types of volatile and non-volatile memory devices.

Figure 7:
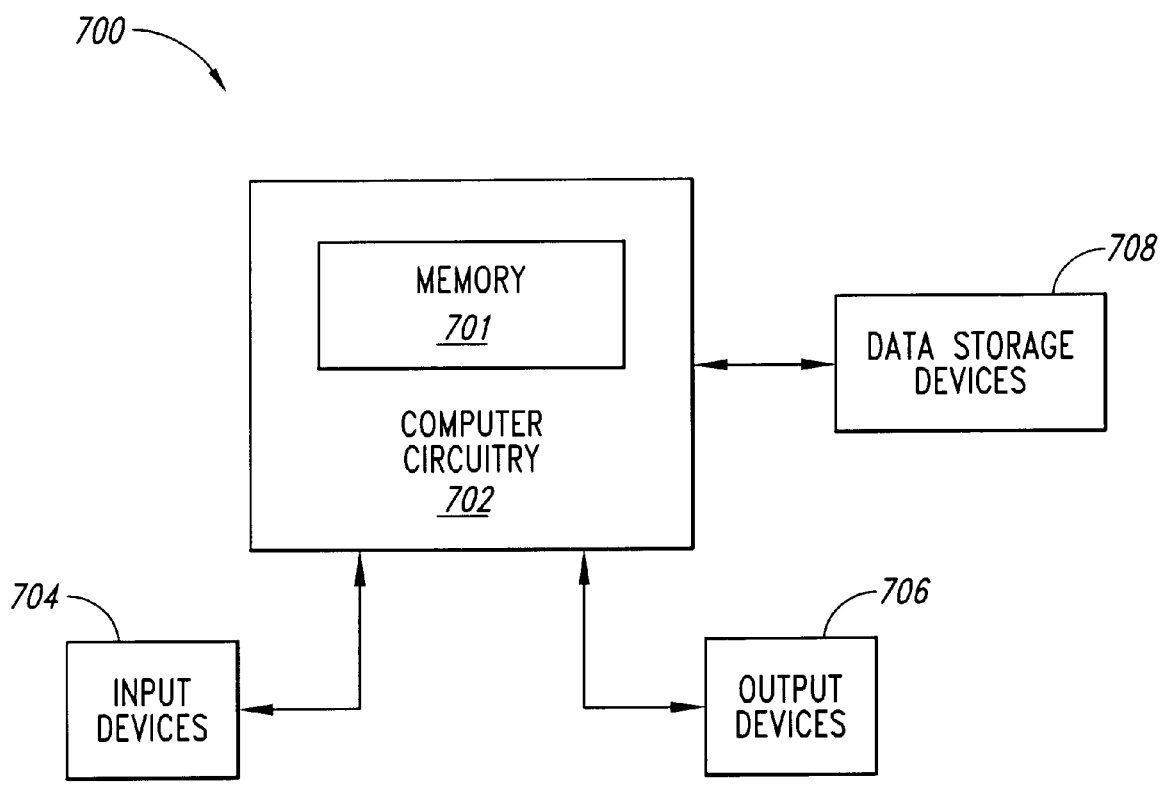
FIG. 7 is a functional block diagram of a computer system including a memory device having a charge pump circuit according to an embodiment of the present invention.

FIG. 7 is a block diagram of a computer system 700 including computing circuitry 702. The computing circuitry 702 contains a memory 701, that can be a volatile memory, such as a DRAM, or a non-volatile memory, such as a FLASH memory. The computing circuitry 702 could also contain both a DRAM and FLASH memory. The memory 701 includes charge pump circuitry according to embodiments of the present invention. The computing circuitry 702 performs various computing functions, such as executing specific software to perform specific calculations or tasks. In addition, the computer system 700 includes one or more input devices 704, such as a keyboard or a mouse, coupled to the computer circuitry 702 to allow an operator to interface with the computer system. Typically, the computer system 700 also includes one or more output devices 706 coupled to the computer circuitry 702, such output devices typically being a printer or a video terminal. One or more data storage devices 708 are also typically coupled to the computer circuitry 702 to store data or retrieve data from external storage media (not shown). Examples of typical storage devices 708 include hard and floppy disks, tape cassettes, and compact disc read-only memories (CD-ROMs). The computer circuitry 702 is typically coupled to the memory device 701 through appropriate address, data, and control busses to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention. For example, some of the components described above may be implemented using either digital or analog circuitry, or a combination of both. Therefore, the present invention is to be limited only by the appended claims.

What is claimed is:

1. An apparatus for providing an elevated output voltage at an output node in response to a first set of pulses during a first phase and a second set of pulses during a second phase, the apparatus comprising:

first and second boot nodes at which a respective elevated voltage is generated, the first and second boot nodes alternatively coupled to the output node during a first portion of the first and second phases, respectively; and a discharging switch coupled to the first and second boot nodes for providing a conductive path through which charge can be shared between the first and second boot nodes during a second portion of the first and second phases.

2. The apparatus of claim 1 wherein the discharging switch is a first discharging switch and the first discharging switch couples the first and second boot nodes during the second portion of the first phase, the apparatus further comprises a second discharging switch coupled to the second and first boot nodes for providing a conductive path between the second and first boot nodes during a second portion of the second phase.

3. An apparatus for providing an elevated output voltage at an output node in response to a first set of pulses during a first phase and a second set of pulses during a second phase, the apparatus comprising:

first and second boot nodes at which a respective elevated voltage is generated;

first and second switches having first and second gate terminals, respectively, the first switch selectively coupling the first boot node to the output node during a first portion of the first phase and the second switch selectively coupling the second boot node to the output node during a first portion of the second phase; and a third switch coupled to the first and second boot nodes for providing a conductive path through which charge can be shared between the first and second boot nodes during a second portion of the first and second phases.

4. The apparatus of claim 3, further comprising a fourth switch coupled to the second and first boot nodes for providing a conductive path between the second and first boot nodes during a second portion of either the first or second phase.

5. The apparatus of claim 3, further comprising a first pair of diode coupled transistors coupled to the first boot node and the first gate terminal and a second pair of diode coupled transistors coupled to the second boot node and the second gate terminal.

6. The apparatus of claim 3, further comprising:

first and second gate pre-charge nodes at which respective elevated voltages are generated;

a first gate pre-charge switch coupled to the first gate pre-charge node and the first gate terminal, the first gate pre-charge switch coupling the first gate pre-charge node and the first gate terminal during the second portion of the second phase; and a second gate pre-charge switch coupled to the second gate pre-charge node and the second gate terminal, the second gate pre-charge switch coupling the second gate pre-charge node and the second gate terminal during the second portion of the first phase.

7. The apparatus of claim 3, further comprising:

a first boot capacitor having a first terminal receiving one of the pulses of the first set and a second terminal coupled to the first boot node; and a second boot capacitor having a first terminal receiving one of the pulses of the second set and a second terminal coupled to the second boot node.

8. An apparatus for generating an elevated output voltage at an output node in response to first and second sets of pulse signals, comprising:

a first pump stage having input terminals for receiving the first set of pulse signals and further having a first boot node from which a boosted output voltage is provided, the first boot node coupled to the output node through a first boot switch;

a second pump stage having input terminals for receiving the second set of pulse signals and further having a second boot node from which a boosted output voltage is provided, the second boot node coupled to the output node through a second boot switch; and first and second discharge switches, the first discharge switch coupled between the first and second boot nodes and responsive to a signal of the first set of pulse signals, the second discharge switch coupled between the second and first boot nodes and responsive to a signal of the second set of pulse signals.

9. The apparatus of claim 8, further comprising a pulse generation circuit, comprising comprises:

a first pulse stage having first, second, and third output terminals to provide first, second, and third pulses, respectively, of a set of first phase signals, each pulse having a respective duration, the first and second pulses of the first phase signals becoming active concurrently and the first duration equal to the sum of the second and third durations of the first phase signals; and a second pulse stage having first, second, and third output terminals to provide first, second, and third pulses, respectively, of a set of second phase signals, each pulse having a respective duration, the first and second pulses of the second phase signals becoming active concurrently and the first duration equal to the sum of the second and third durations of the second phase signals.

10. The apparatus of claim 9 wherein the first pump stage includes a first boot capacitor having a first terminal coupled to the first output terminal of the first pulse stage and a second terminal coupled to the first boot node and the second pump stage includes a second boot capacitor having a first terminal coupled to the first output terminal of the second pulse stage and a second terminal coupled to the second boot node.

11. The apparatus of claim 9 wherein the first boot switch is activated for the second duration of the set of first phase signals and the first discharge switch is activated for the third duration of the set of first phase signals, and the second boot switch is activated for the second duration of the set of second phase signals and the second discharge switch is activated for the third duration of the set of second phase signals.

12. The apparatus of claim 8, further comprising:

first and second gate pre-charge nodes at which a respective voltage is generated;

a first gate pre-charge switch coupled to the first gate pre-charge node and a gate of the first boot switch to pre-charge the gate of the first boot switch with the voltage generated at the first gate pre-charge node; and a second gate pre-charge switch coupled to the second gate pre-charge node and a gate of the second boot switch to pre-charge the gate of the second boot switch with the voltage generated at the second gate pre-charge node.

13. A method of providing a boosted voltage at an output node, comprising:

alternately boosting voltage of first and second boot nodes;

alternately coupling first and second boot nodes to the output node; and discharging charge from the first boot node to the second boot node prior to boosting the voltage of the second boot node and discharging charge from the second boot node to the first boot node prior to boosting the voltage of the first boot node.

14. The method of claim 13, further comprising pre-charging the first and second boot nodes to an operating voltage.

15. The method of claim 13 wherein coupling the first boot node to the output node comprises:

pre-charging a third node with a boosted voltage;

boosting the voltage of the third node; and coupling a gate of a transistor to the third node, the transistor coupling the first boot node to the output node in response thereto.

16. The method of claim 13, further comprising applying a voltage pulse to a first terminal of a capacitor having a second node coupled to the first boot node to boost the voltage of the first boot node.

17. The method of claim 13 wherein discharging charge from the first boot node to the second boot node comprises:

de-coupling the first boot node from the output node; and coupling the first boot node to the second boot node.

18. The method of claim 13, further comprising:

generating a first pulse having a first duration, the first pulse applied to boost the voltage of the first node; and generating a second pulse having a second duration less than the first duration, the second pulse applied to couple the first boot node to the output node.

19. The method of claim 18, further comprising generating a third pulse applied to electrically couple the first boot node to the second boot node.

20. The method of claim 19 wherein the first and second pulses activate concurrently, the third pulse has a third duration, and the sum of the second and third durations equal the first duration.

* * * * *

UNITED STATES PATENT AND TRADEMARK OFFICE
CERTIFICATE OF CORRECTION

PATENT NO.    : 6,532,177 B1
DATED         : March 11, 2003
INVENTOR(S)   : Hal W. Butler It is certified that error appears in the above-identified patent and that said Letters Patent is hereby corrected as shown below:

Title page,
Please insert -- Prior Publication Data, US 2003/0043642 A1 March 6, 2003 --

Item [56], References Cited, please insert the following references:

|  |  |  |  |
|---|---|---|---|
| -- 5,677,645 | 10/1997 | Merritt ................. | 327/536 |
| 6,172,935 B1 | 1/2001 | Wright et al. ........... | 365/233 |
| 6,294,948 B1 | 9/2001 | Blodgett .................. | 327/536 -- |

Column 2,
Line 57, "In a sever case" should read -- In a severe case --
Line 68, "from relatively a low" should read -- from a relatively low --

Column 3,
Line 5, "response a first set" should read -- response to a first set --
Line 25, "diagram of conventional" should read -- diagram of a conventional --

Column 4,
Line 9, "provided to chain of" should read -- provided to a chain of --
Line 12, "circuit 326a The pulse" should read -- circuit 326a. The pulse --
Line 18, "input coupled the" should read -- input coupled to the --
Line 40, "because of the output of the" should read -- because the output of the --
Line 56, "return LOW at time a $t_4$." should read -- return LOW at a time $t_4$. --

Column 5,
Line 67, "and the second pwnp phase" should read -- and the second pump phase --

Column 6,
Line 2, "(FIG. 4), thus, booting" should read -- (FIG. 4), thus booting --
Line 43, "booted by PH2B signal," should read -- booted by the PH2B signal, --
Line 53, "FIG. 6, that is, as the P2A signal decreasing between time $t_3$" should read -- FIG. 6; that is, the P2A signal is decreasing between time $t_3$ --

UNITED STATES PATENT AND TRADEMARK OFFICE
CERTIFICATE OF CORRECTION

PATENT NO.    : 6,532,177 B1
DATED         : March 11, 2003
INVENTOR(S)   : Hal W. Butler It is certified that error appears in the above-identified patent and that said Letters Patent is hereby corrected as shown below:

<u>Column 9,</u>
Line 4, "comprising comprises:" should read -- comprising: --

Signed and Sealed this

Tenth Day of February, 2004

JON W. DUDAS
*Acting Director of the United States Patent and Trademark Office*